(12) United States Patent
Yang et al.

(10) Patent No.: US 7,724,075 B2
(45) Date of Patent: May 25, 2010

(54) METHOD TO PROVIDE A HIGHER REFERENCE VOLTAGE AT A LOWER POWER SUPPLY IN FLASH MEMORY DEVICES

(75) Inventors: Tien-Chun Yang, San Jose, CA (US); Yonggang Wu, Santa Clara, CA (US); Nian Yang, Mountain View, CA (US)

(73) Assignee: Spansion LLC, Sunnyvale, CA (US)

( * ) Notice: Subject to any disclaimer, the term of this patent is extended or adjusted under 35 U.S.C. 154(b) by 117 days.

(21) Appl. No.: 11/634,776

(22) Filed: Dec. 6, 2006

(65) Prior Publication Data
US 2008/0136381 A1 Jun. 12, 2008

(51) Int. Cl.
*G05F 1/575* (2006.01)
(52) U.S. Cl. .................. 327/541; 327/543; 323/311
(58) Field of Classification Search .................. None
See application file for complete search history.

(56) References Cited

U.S. PATENT DOCUMENTS

| | | | | | |
|---|---|---|---|---|---|
| 5,300,877 | A | * | 4/1994 | Tesch | 323/313 |
| 6,078,207 | A | * | 6/2000 | Oguri | 327/321 |
| 6,091,268 | A | * | 7/2000 | Ooishi et al. | 327/77 |
| 6,201,381 | B1 | * | 3/2001 | Yasuda | 323/315 |
| 6,297,687 | B1 | * | 10/2001 | Sugimura | 327/536 |
| 6,329,804 | B1 | * | 12/2001 | Mercer | 323/315 |
| 6,404,274 | B1 | * | 6/2002 | Hosono et al. | 327/538 |
| 6,696,884 | B1 | * | 2/2004 | Seven | 327/540 |
| 6,781,417 | B1 | | 8/2004 | Le et al. | |
| 6,970,011 | B2 | * | 11/2005 | Arnold | 326/32 |
| 7,215,196 | B2 | * | 5/2007 | Banba et al. | 330/254 |
| 7,342,440 | B2 | * | 3/2008 | Bodano et al. | 327/564 |
| 7,606,085 | B2 | * | 10/2009 | Wada et al. | 365/189.09 |

OTHER PUBLICATIONS

"A Low Voltage Bandgap Reference Circuit with Current Feedback", Tao Li, Bhaskar Mitra and Kabir Udeshi, reprinted from the Internet at: www.eecs.umich.edu/-mpflynn/Design_Contest/Fall2003/Reports/kabir_bhaskar_tao.pdf, 5 pgs.

* cited by examiner

*Primary Examiner*—Lincoln Donovan
*Assistant Examiner*—Terry L Englund
(74) *Attorney, Agent, or Firm*—Eschweiler & Associates, LLC

(57) ABSTRACT

A fast reference circuit having active feedback includes a bias supply circuit and a variable divider circuit connected by an active feedback path to the bias supply circuit, and a comparator circuit connected to the variable divider circuit, the bias supply circuit, and a reference node of the variable divider circuit. In one embodiment, a start-up circuit initially discharges a potential at the bias supply and comparator circuits, then initializes a reference voltage at the reference node at about zero volts to improve repeatability. In one embodiment, the variable voltage divider comprises an impendence that is trimmed based on a sheet resistance of a process used to fabricate the fast reference circuit, and further comprises a variable reference current circuit coupled to the impedance and configured to generate a current having a value based on a desired reference voltage and to conduct the current through the impedance, thereby generating the reference voltage associated therewith. The comparator circuit is configured to compare the bias supply voltage to the reference voltage, and drive the bias supply and the variable divider circuit in response to the comparison, thereby quickly stabilizing the reference voltage.

28 Claims, 13 Drawing Sheets

US 7,724,075 B2

METHOD TO PROVIDE A HIGHER REFERENCE VOLTAGE AT A LOWER POWER SUPPLY IN FLASH MEMORY DEVICES

FIELD OF INVENTION

This invention relates to electronic circuits and more particularly relates to voltage reference circuits for flash memory devices.

BACKGROUND OF THE INVENTION

Voltage and current reference circuits find many applications in electronic circuits including Flash and other types of electronic memory device applications. The bandgap reference circuit is a common circuit solution for supplying a voltage or current reference for such applications. FIG. 1 is a prior art bandgap circuit 100 and operates generally as follows. P1 and P2 act as a standard MOS current mirror providing current to Q1 and Q2, which are configured as a bipolar current mirror. Q1 and Q2 are sized differently; therefore, although they conduct the same current, they have different current densities. Therefore, there will be a difference in their $V_{be}$ voltages and the difference will be reflected in the current through R1. VREF is a voltage reference that is a function of the current through R2 and the base-emitter voltage $V_{be}$ of Q3. Since the current through R2 is mirrored from P1 it is seen that the current through P3 is a function of $\Delta V_{be}$ between Q1 and Q2 and R1. Therefore, VREF is a function of the $\Delta V_{be}$ between Q1 and Q2, the ratio in resistor values R1 and R2, and $V_{be}$ of Q3. The current mirror insures equal collector currents $I_C$ an saturation currents $I_S$ through Q1 and Q2. Note that Q1 is n times bigger than Q2, thus:

$$\Delta V_{be} = V_{BE,Q2} - V_{BE,Q1} = V_T \ln(I_C/I_S) - V_T \ln(I_C/nI_S) = k(T/q)\ln(n).$$

$\Delta V$be exhibits a positive temperature coefficient (+TC). If the positive temperature coefficient of $\Delta V$be is combined with VBE,Q3, which has a negative temperature coefficient (-TC), along with the correct weighting ratios of R1 and R2, VREF will have approximately a zero temperature coefficient, and VREF will be independent of temperature. This ratio is determined by taking the equation for VREF that incorporates all temperature dependencies, differentiating with respect to temperature, and setting the equation equal to zero. For example, from FIG. 1, we can calculate VREF as:

$$VREF = V_{BE,Q3} + R2(mI_C) = V_{BE,Q3} + R2(m\,\Delta V_{be}/R1)$$
$$= V_{BE,Q3} + m(R2/R1)\ln(n)kT/q \text{ and:} \quad (1)$$

$$\partial VREF/\partial T = \partial V_{be}/\partial T + m(R2/R1)\ln(n)k/q \quad (2)$$

As discussed, to have a reference that is substantially independent of temperature, equation (2) should be zero, or:

$$\partial VREF/\partial T = \partial V_{be}/\partial T + m(R2/R1)\ln(n)k/q = 0 \quad (2)'$$

If we assume a typical value of positive temperature coefficient for $\partial V_{be}/\partial T$:

$$\partial V_{be}/\partial T = -1.5 \text{ mV}/°K$$

When this value is substituted into equation 2', and solved for VREF, a new value for VREF is obtained having a zero temperature coefficient, where:

VREF=1.25V

This is well known by those skilled in the art of bandgap reference circuits.

The above explanation of prior art circuit 100 of FIG. 1 assumes that the gain-bandwidth product of the reference circuit. temperature, operation speeds, and manufacturing tolerances remain within limited bounds. However, in many cases, this is not a valid assumption. Often, integrated circuits must operate, for example, combinations of high speeds, extreme temperatures, extreme process corners, and low voltages. Under some of these conditions, the gain-bandwidth product of the reference circuit may be inadequate.

Additionally, as device densities and speed requirements continue to increase, the speed requirement of the reference circuit may need to increase to keep pace with the remainder of the circuit, including a reference circuit used to supply, for example, the reference voltage for a word line or a voltage booster of a memory circuit. Further, as supply voltage levels decrease due to these higher density architectures, device speed requirements may be increasingly difficult to obtain, particularly at low supply voltage and reference levels, and at low operating currents over wide operating temperatures. These issues are particularly evident during read operations at low power supply voltages (Vcc's) wherein the read margin decreases, resulting in an inaccurate read at low supply voltages. In Flash devices, typically, the smaller the read margin at low Vcc's may be due to a reduced reference voltage at low Vcc.

It should also be noted that in the typical bandgap reference circuit of FIG. 1, the current mirror is usually in the cascode form to reduce the variation of VREF with respect to the supply voltage $V_{CC}$. The particular arrangement of bandgap voltage reference of FIG. 1, however, can not be used directly for the high speed circuits being considered, because of reduction in the gain-bandwidth product of the reference at higher speeds and low power supply voltages. Accordingly, there is a need to provide a means of compensation that reduces the negative effects of a low $V_{CC}$ supply voltage applied to a reference voltage circuit operating at high speeds and low power supply and reference levels, while accommodating a wide range of temperature and process variations.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is to present some concepts of the invention in a simplified form as a prelude to the more detailed description that is presented later.

The present invention relates to an electronic circuit and a method for producing a fast reference voltage (FVREF) or reference current. A fast voltage reference circuit includes a bias supply connected to a comparator circuit that in turn is connected to a variable divider circuit and to a feedback path to the bias supply. The fast voltage reference circuit may be used to supply, for example, the reference voltage for a word-line or a voltage booster in a memory circuit.

In one embodiment, the fast voltage reference circuit further comprises a start-up circuit that initially discharges a potential at the bias supply and comparator circuits, then initializes a reference voltage generated at a reference node of the variable divider circuit at about zero volts in order to improve repeatability.

In one embodiment, the variable voltage divider comprises an impendence that may be trimmed based on a sheet resistance of a process used to fabricate the fast reference circuit.

In another embodiment, the variable divider circuit comprises a variable reference current circuit coupled to the impedance and is configured to generate a current having a value based on a desired reference voltage, wherein the reference current conducts through the impedance generating the reference voltage associated therewith. In one embodiment, the reference voltage is generated at a reference node of the variable divider circuit across the variable reference current circuit.

The comparator circuit is configured to compare the bias supply voltage to the reference voltage, and drive the bias supply via the active feedback path and the variable divider circuit in response to the comparison, thereby quickly stabilizing the reference voltage FVREF to a final level, thereby producing a stable, fast reference voltage signal FVREF that is substantially independent of supply voltage and process variations.

In one embodiment, the variable reference current circuit comprises a plurality of reference current sources that may be selected by respective MOS selection transistors coupled to a diode connected high voltage MOS enhancement transistor coupled to the reference node of the variable divider circuit. The variable reference current circuit sources a current to the impedance to translate the current into a reference voltage signal (FVREF). The voltages across the divider circuit are feedback to the bias supply by the active feedback path. In one aspect of the invention the bias supply comprises a resistor voltage divider. The bias supply provides a feed back voltage to the comparator, which compares this voltage to the reference voltage (FVREF), and in turn drives the variable divider circuit to quickly regulate the reference voltage FVREF to the final level, thereby producing a stable, fast reference voltage signal FVREF that is substantially independent of supply voltage and process variations.

According to one aspect of the present invention, the impedance comprises one or more unsilicided polysilicon material resistors.

In another aspect of the invention, the variable reference current circuit comprises a plurality of selectable reference current sources individually configured to provide a reference current, configured such that one or more of the plurality of reference currents may be selectively summed to generate a current thru the impedance having a value based on the desired reference voltage.

In yet another aspect of the invention, the plurality of selectable reference current sources individually comprise a MOS selection transistor series connected to an enhancement type high voltage MOS transistor configured as a diode, wherein one or more of the plurality of reference current sources are selected by one or more respective selection transistors.

In one embodiment, a method of providing a fast and stable reference voltage, comprises: providing an impedance for a variable divider circuit, selecting a variable current reference for the variable divider circuit based on a desired reference voltage, translating the reference current through the impedance into the reference voltage, comparing the reference voltage to a bias supply voltage which varies as a function of feedback from a node of the variable divider circuit having a negative function of a supply voltage and substantially no function of temperature, and driving the differential voltage of the comparison into the variable divider circuit to rapidly stabilize the reference voltage substantially independent of variations in supply voltage and process variations.

The aspects of the invention find application in devices that include, for example, word line and high speed voltage booster circuits requiring a higher reference voltage while operating at low supply voltage or low supply current levels, requiring a higher speed reference voltage, while accommodating a wide range of supply voltages, temperatures and process variations.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
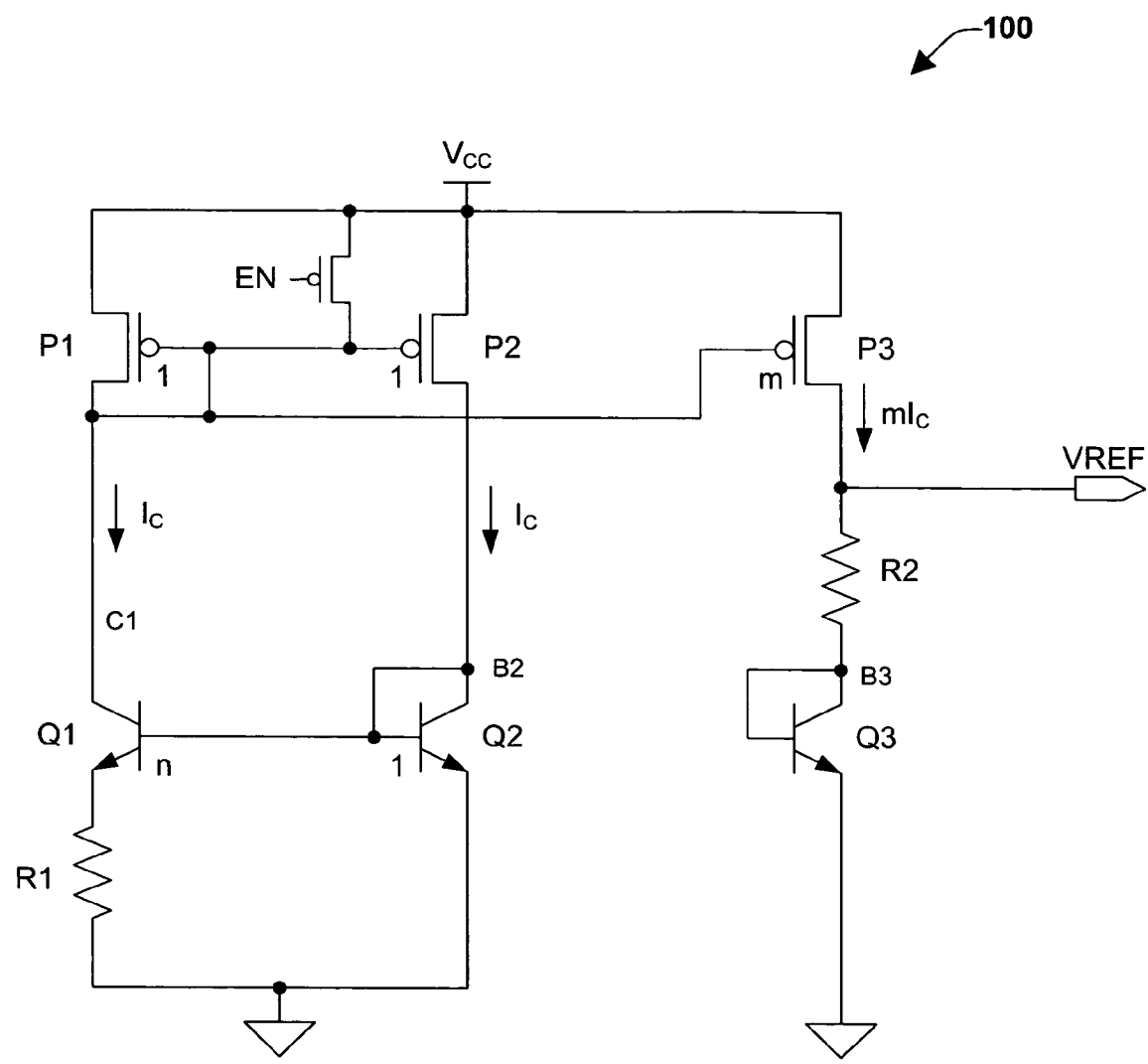
FIG. 1 is a schematic diagram illustrating a prior art bandgap voltage reference circuit 100.

The present invention will now be described with reference to the drawings, wherein like reference numerals are used to refer to like elements throughout. The figures and the accompanying description of the figures are provided for illustrative purposes and do not limit the scope of the claims in any way. The present invention relates to an electronic circuit for producing a fast voltage or current reference which is substantially independent of supply voltage fluctuations, and which may be used, for example, to provide a fast reference voltage for a word line or a voltage booster for the read mode operations of memory cells. The invention comprises bias supply and comparator circuits, a variable divider circuit, and a feedback path between the variable divider circuit and the bias supply.

Figure 2A:
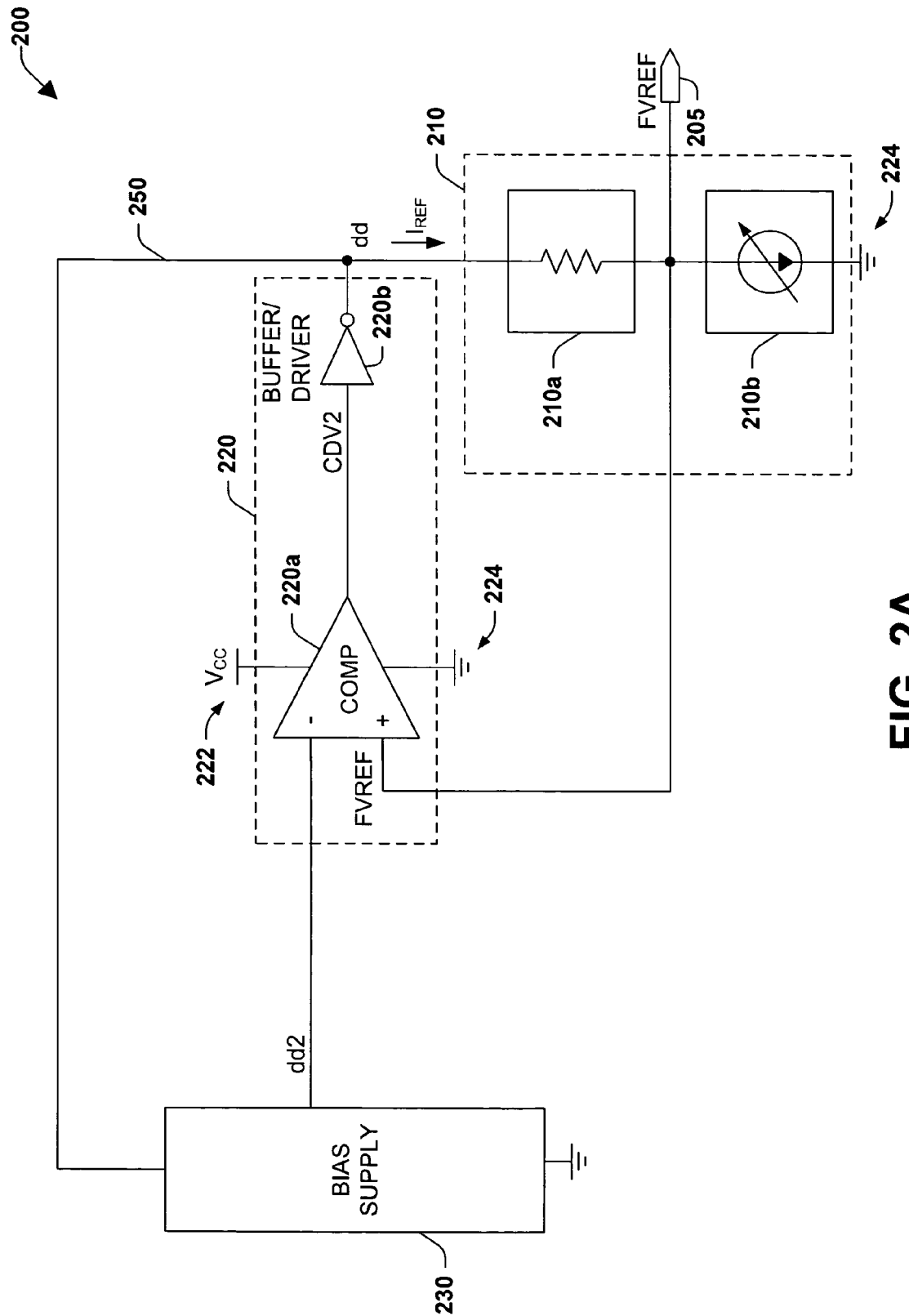
FIGS. 2A, 2B, and 2C are system level functional block diagrams illustrating exemplary fast voltage reference circuits 200, 201, and 202, respectively, in which various aspects of the invention may be carried out.
Figure 2B:
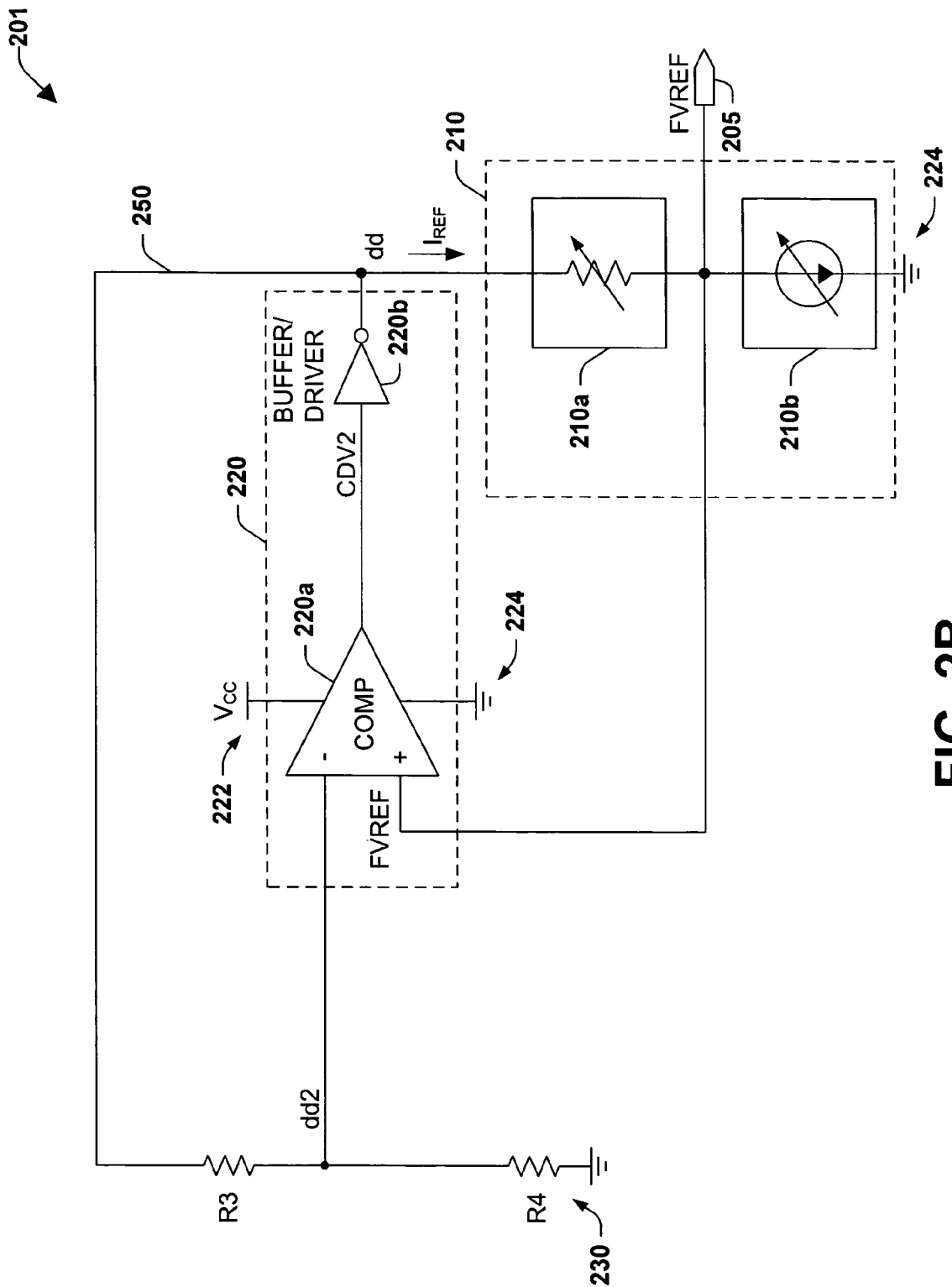
Figure 2C:
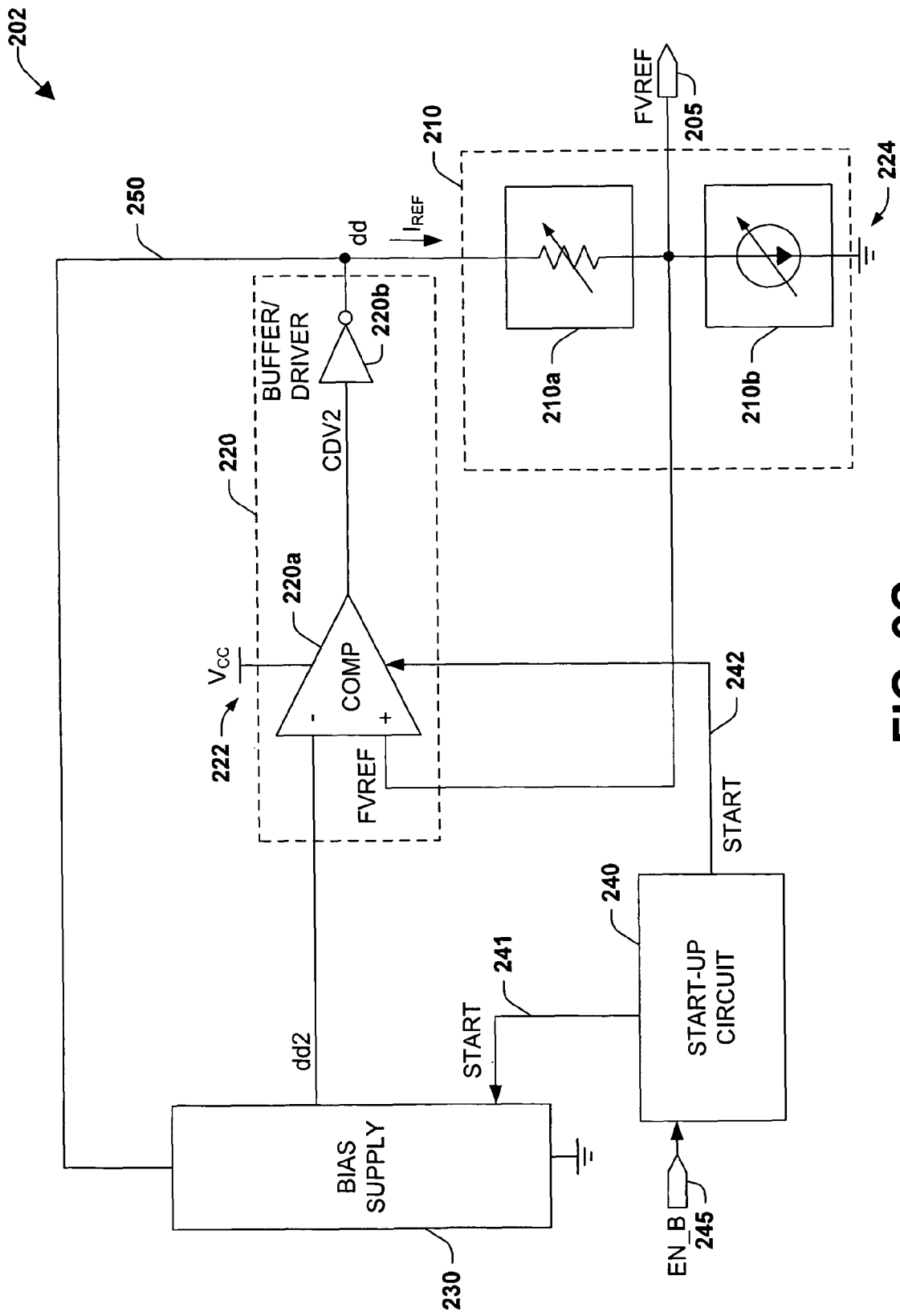

FIGS. 2A, 2B, and 2C illustrate system level functional block diagrams of exemplary fast voltage reference circuits 200, 201, and 202, respectively, in which various aspects of the invention may be carried out.

FIG. 2A, for example, illustrates a system level functional block diagram of an exemplary fast voltage reference circuit 200, for producing a fast voltage reference FVREF 205, which may be used, for example, to provide a fast settling time (e.g., about 3-5 ns from Vss to the target FVREF level of about 1.15 volts, compared to about 25 ns in a conventional bandgap circuit) higher level reference voltage for a wordline or voltage booster for the read mode operations of flash memory cells. Fast reference circuit 200 comprises a variable divider circuit 210, a comparator circuit 220 having an output connected to the variable divider circuit 210 at node "dd" and a first input connected to an output "dd2" of a bias supply circuit 230 which resides within an active feedback path 250 back to the first input of the comparator circuit 220. A second input FVREF of the comparator circuit 220 is connected to the fast voltage reference FVREF 205 at a reference node 205 of the variable divider circuit 210. A further understanding of this functional block diagram will be explained in greater detail in connection with FIG. 3 and following.

Returning to FIG. 2A, the $V_{CC}$ power supply 222 and circuit ground 224 is applied to the fast voltage reference circuit 200, to supply power for the reference operation. $V_{CC}$ variations are conventionally regulated by a current mirror circuit within the comparator circuit 220 as previously discussed to generally maintain a constant voltage at output node dd, and the fast reference voltage FVREF at the reference node 205 that is substantially independent of variations in $V_{CC}$.

Variable divider circuit 210 comprises an impedance 210a (e.g., a resistor, a plurality of selectable resistors, a variable resistor) that may be initially trimmed and/or selected based on a sheet resistance of the process which is used to fabricate the fast voltage reference circuit 200. When a new wafer, wafer lot, die or die lot is fabricated, for example, the sheet resistance of a process may exhibit variations of about +/−20%. Such sheet resistance variations my be mitigated by initially trimming the impedance 210a or resistors used in the variable divider circuit 210, or in any resistors (e.g., R3, and R4) of the voltage divider used in the bias supply 230, for example, as shown in fast voltage reference circuit 201 of FIG. 2B.

Variable divider circuit 210 further comprises a variable reference current circuit 210b (e.g., a variable reference current source, one or more selectable reference current sources, one or more diode connected transistors) operable to generate a reference current $I_{REF}$ that may be selected based on a desired reference voltage FVREF desired for the fast voltage reference circuit 200 or 201, for example. The reference current $I_{REF}$ of the reference current circuit 210b associated with the desired voltage reference FVREF, conducts thru the impedance 210a to produce a voltage across impedance 210a and the desired voltage reference FVREF across variable reference current circuit 210b. Thus, the variable reference current $I_{REF}$ within the fast reference circuit 200, 201, 202 of the present invention, is operable to generate a desired fast reference voltage FVREF at reference node 205.

FIG. 2C further illustrates another exemplary fast voltage reference circuit 202, for producing a fast voltage reference FVREF 205, which may be used, for example, to provide a fast settling time higher level reference voltage for a wordline or voltage booster for the read mode operations of flash memory cells. Fast reference circuit 202 further comprises a start-up circuit 240 enabled, for example, by an enable signal EN_B 245, to initialize the fast reference voltage circuit 202 at a known and/or repeatable level for improved repeatability. In the embodiment illustrated in FIG. 2C, the start-up circuit 240 is configured and operable to enable, start and/or initialize the bias supply 230 and comparator circuit 220 upon receipt of the EN_B 245 enable signal. In this embodiment, a start signal 241 enables the bias supply 230, while start signal 242 enables and/or initializes the comparator circuit 220 from zero volts, for example, by discharging the output of comparator 220a to supply ground 224.

In the present invention, for example, an impedance 210a and a reference current $I_{REF}$ via reference current circuit 210b are provided to the variable divider circuit 210 based on a desired reference voltage FVREF. The reference current $I_{REF}$ of reference current circuit 210b is translated through the impedance 210a into a reference voltage FVREF 205 across the reference current circuit 210b at the reference node 205. The reference voltage FVREF 205 is compared to a bias supply voltage dd2 which varies as a function of the active feedback path 250 from node dd of the variable divider circuit 210, having negative function of a supply voltage $V_{CC}$ 222 and substantially no function of temperature (e.g., a zero temperature coefficient, or $T_C$). The comparator circuit 220 then drives the differential voltage of the comparison into the variable divider circuit 210 to rapidly stabilize the reference voltage FVREF 205. Thus a stable, fast reference voltage signal FVREF 205 is provided that is substantially independent of supply voltage $V_{CC}$ and process variations.

Figure 3A:
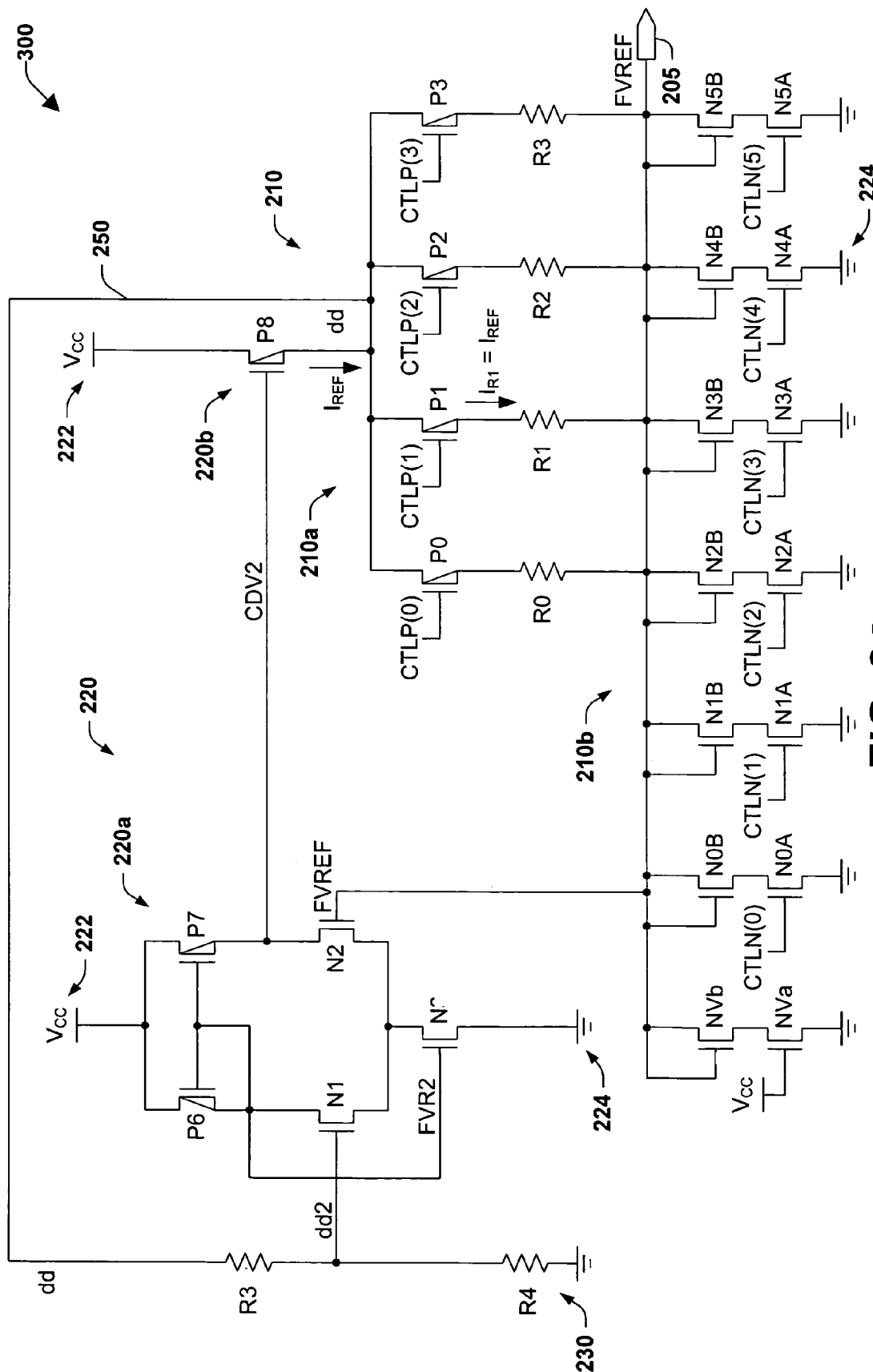
FIGS. 3A, 3B, and 3C are schematic diagrams illustrating exemplary fast voltage reference circuits 300, 301, and 301, respectively, in accordance with several aspects of the invention.
Figure 3B:
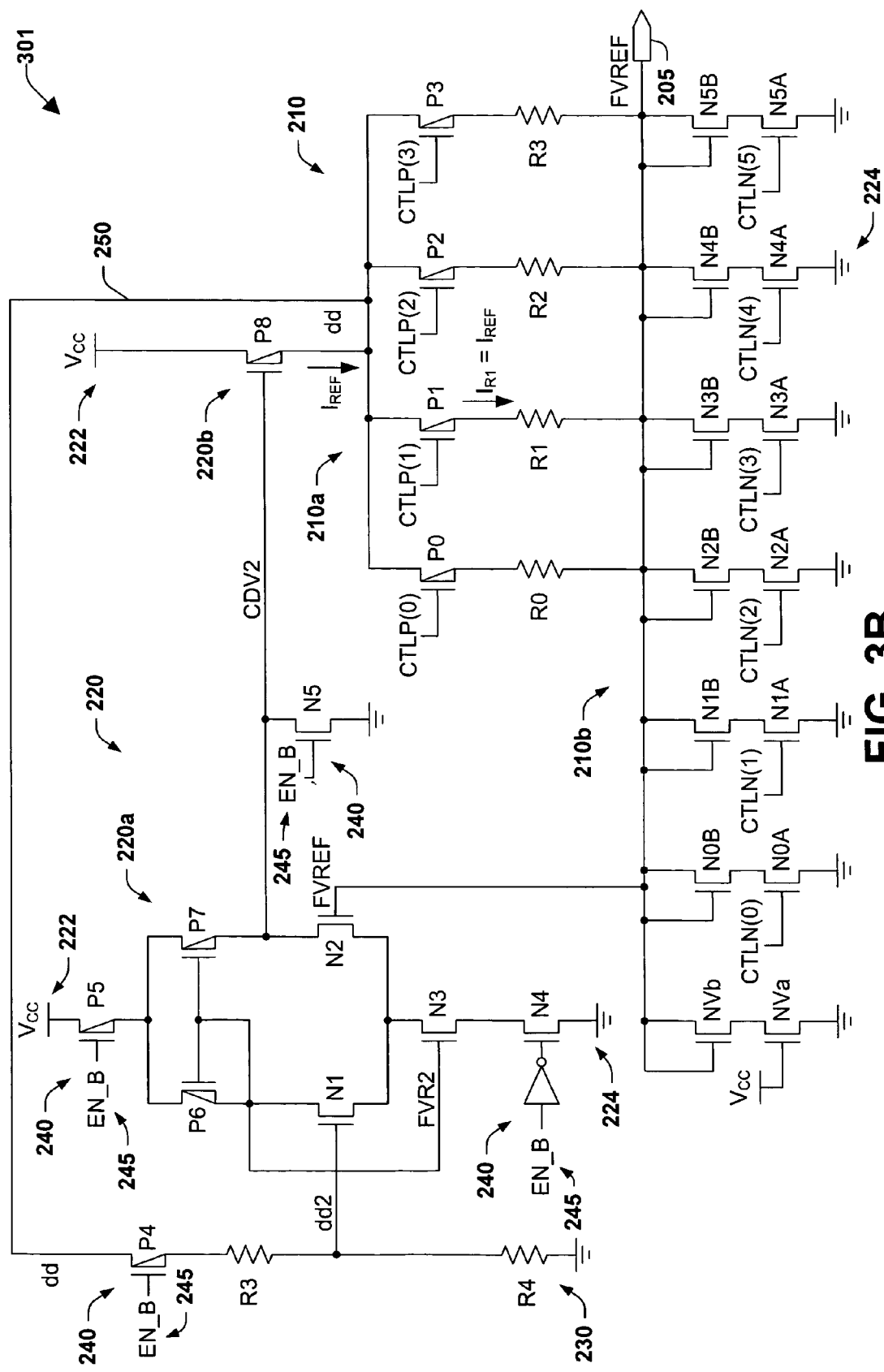
Figure 3C:
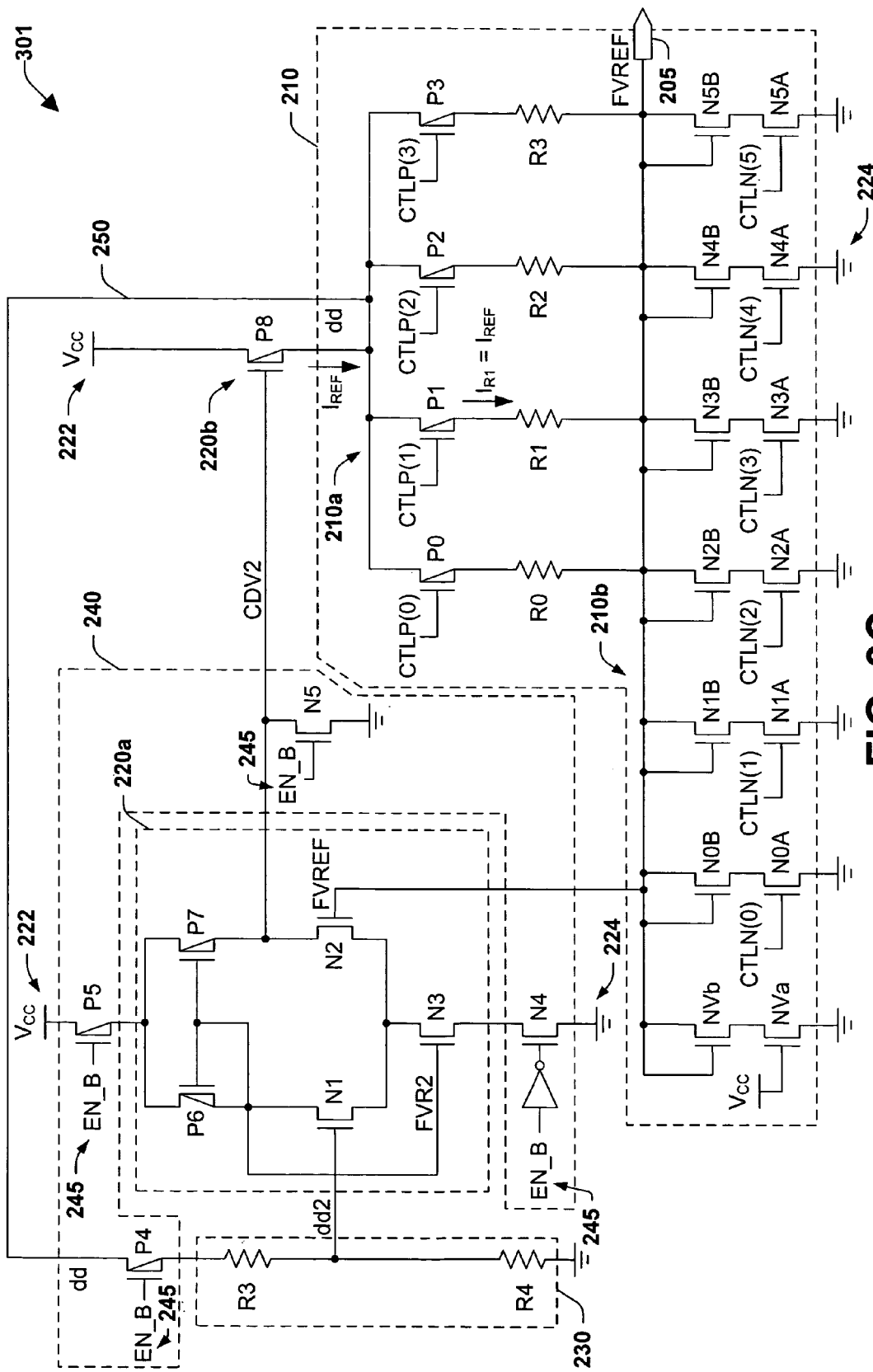

FIGS. 3A, 3B, and 3C illustrate exemplary embodiments of fast voltage reference circuits 300, 301, and 301, respectively, in accordance with several aspects of the invention and are similar in various aspects to the fast voltage reference circuits of FIGS. 2A, 2B, and 2C.

FIG. 3A, for example, illustrates an exemplary fast voltage reference circuit 300, for producing a fast voltage reference FVREF 205, for example, used to provide a fast settling time higher level reference voltage for a wordline or voltage booster for the read mode operations of flash memory cells. Fast reference circuit 300 comprises a variable divider circuit 210, a comparator circuit 220 having an output connected to the variable divider circuit 210 at node "dd" and a first input connected to an output "dd2" of a bias supply circuit 230 which resides within an active feedback path 250 back to the first input of the comparator circuit 220. A second input FVREF of the comparator circuit 220 is connected to the fast voltage reference FVREF 205 at a reference node 205 of the variable divider circuit 210.

In one embodiment, variable divider circuit 210 comprises an impedance circuit 210a and a variable reference current circuit 210b. In the example of FIG. 3A, impedance or impedance circuit 210a comprises a plurality of resistors R0-R3 selected by control inputs CTLP(0-3) to pMOS selection transistors P0-3. For example, R1 may be selected by CTLP (1) and P1, depending on a measured sheet resistance of the fabricated device or an average sheet resistance of the entire wafer. In one embodiment, for example, if the sheet resistance is determined to be in one of four ranges, one of the four selection transistors is respectively selected. For example, a plurality of unsilicided polysilicon resistors may be utilized for the impedance, wherein if a sheet resistance in the range of 565 to 615 is determined, CTLP(0) is selected;

if a sheet resistance in the range of 615 to 670 is determined, CTLP(1) is selected;

if a sheet resistance in the range of 670 to 735 is determined, CTLP(2) is selected; and if a sheet resistance in the range of 735 to 800 is determined, CTLP(3) is selected.

Although only one resistance is selected in the above example, two or more resistors or another type of impedance circuit may be utilized herein to provide a fixed or variable resistance, as will be discussed further hereinafter in association with FIGS. 4A-4D.

In one embodiment, the variable reference current circuit 210b comprises a plurality of reference current sources N0B-N5B selected by control inputs CTLN(0-5) to nMOS selection transistors N0A-N5A, and it may also further comprise a fixed reference current source NVb controlled by selection transistor NVa. In this example, fixed reference current source NVb provides a minimal current reference during initial conditions or other situations when all other current references are deselected. Although six selectable current references and one fixed current reference is utilized in the present example, any number of selectable or fixed current references is anticipated herein. In another aspect of the invention, a plurality of current reference sources may be selected by a digital to analog converter (DAC) circuit as will be discussed further in association with FIG. 4B. In addition, one or more current references of the variable reference current circuit 210b may be selected herein to provide the current reference desired and thus the desired voltage reference FVREF 205, as will be discussed further hereinafter in association with FIGS. 4A and 4B.

Returning to FIG. 3A, the comparator circuit 220 of the fast voltage reference circuit 300, comprises a comparator 220a and a buffer or driver 220b. The comparator 220a comprises nMOS transistors N1, N2, and N3, and pMOS transistors P6 and P7. Transistors N1 and N2 of comparator 220a amplify the differential voltages therebetween from dd2 of the bias supply 230 and FVREF of the variable divider circuit 210. PMOS transistor P6 and P7 are configured as a standard MOS current mirror within the comparator 220a, while nMOS transistor N3 provides a constant current source for the N1/N2 differential pair. Feedback voltage FVR2 is coupled to nMOS transistor N3 from the P6 and P7 current mirror to further amplify the differential voltage and insure saturation of the comparator 220a. Buffer/driver pMOS transistor P8 further amplifies, inverts, and drives the output node dd of the comparator circuit 220, the variable divider circuit 210, and the active feedback path 250 to the bias supply 230 such that the desired voltage reference FVREF 205 is maintained at a substantially constant voltage.

The bias supply 230 of the fast voltage reference circuit 300, comprises a voltage divider comprising resistors R3 and R4 having a bias supply voltage at a bias supply node dd2. Rather than a fixed bias supply level, as may be conventionally employed, the bias supply voltage dd2 of the present invention actively responds to feedback from the variable divider circuit in order to more quickly respond to variations in the $V_{CC}$ power supply 222, for example. As with the resistors of the impedance circuit 210a, the resistors of the bias supply 230 may also be initially trimmed to mitigate process variations encountered during fabrication of the device.

Returning to FIG. 3A, the $V_{CC}$ power supply 222 and circuit ground 224 is applied to the fast voltage reference circuit 300, to supply power for the reference operation. $V_{CC}$ variations are conventionally regulated by the current mirror circuit (e.g., of P6 and P7) within the comparator 220a as previously discussed to generally maintain a constant voltage at comparator output node dd, and the fast reference voltage FVREF at the reference node 205 substantially independent of variations in $V_{CC}$.

FIGS. 3B and 3C further illustrate another exemplary fast voltage reference circuit 301, for producing a fast voltage reference FVREF 205, which may be used, for example, to provide a fast settling time higher level reference voltage for a wordline or voltage booster for the read mode operations of flash memory cells. Fast reference circuit 301 of FIGS. 3B and 3C illustrate the same circuit, however, circuit 301 of FIG. 3C illustrates dashed lines around the various circuit groupings for the sake of further understanding. Fast reference circuit 301 further comprises an exemplary start-up circuit 240 that may be enabled, for example, by an enable signal EN_B 245 (e.g., provided by a control circuit within the start-up circuit 240 but not shown), to initialize the fast reference voltage circuit 301 from a known and/or repeatable level for improved repeatability. Start-up circuit 240 provides repeatable operation each time the fast reference circuit is started, and a predictable settling time whether the circuit was recently activated, or after a long period of inactivity.

In the embodiments illustrated in FIGS. 3B and 3C, the start-up circuit 240 is configured and operable to enable the bias supply 230 and to start and/or initialize comparator 220a of the comparator circuit 220 upon receipt of the enable signal EN_B 245. In this embodiment, when enable signal EN_B 245 goes low, pMOS transistor P4 conducts to enable the bias supply 230, pMOS transistor P5 and nMOS transistor N4 (via an inverter) conduct to enable the comparator 220a, and nMOS transistor N5 at the output of comparator 220a opens to remove a short at node CDV2 from the supply ground, thereby initializing the comparator circuit 220 (e.g., from a predetermined reference voltage, about zero volts) to improve repeatability in the generation of the reference voltage. Although MOS transistors are illustrated herein, other switching elements and start-up circuit configuration variations are also contemplated in the context of the present invention.

FIGS. 4A-4D illustrate exemplary variable divider circuits 210 and the fast voltage reference FVREF such as may be used in the fast voltage reference circuits of FIGS. 2A, 2B, and 2C.

Figure 4A:
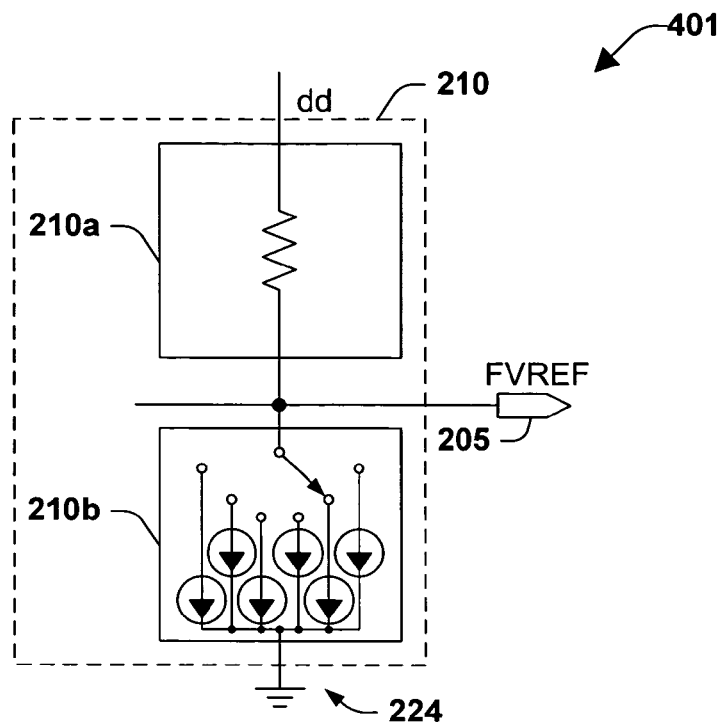
FIGS. 4A-4D are simplified schematic diagrams illustrating exemplary variable divider circuits 210 and the fast voltage reference FVREF such as may be used in the fast voltage reference circuits of FIGS. 2A, 2B, and 2C.
Figure 4B:
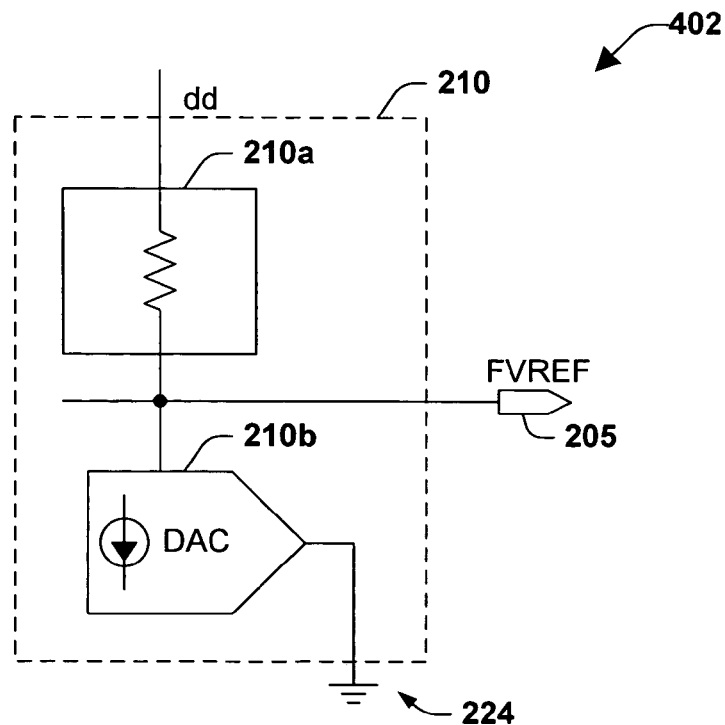

FIGS. 4A and 4B, for example, illustrate embodiments of a variable divider circuit 401, and 402, respectively, of the variable divider circuit 210 of FIG. 2A, comprising an impedance 210a and a variable reference current circuit 210b series connected as a voltage divider circuit 210. In these embodiments, impedance 210a is represented as a fixed resistance, however, this resistance may also represent the final selected resistance of a resistance trimming or resistance selection circuit, for example, after an initial trimming or selection operation which may be based on a sheet resistance of the die, wafer, or wafer lot, due to the technology or process used to fabricate the same.

Figure 4C:
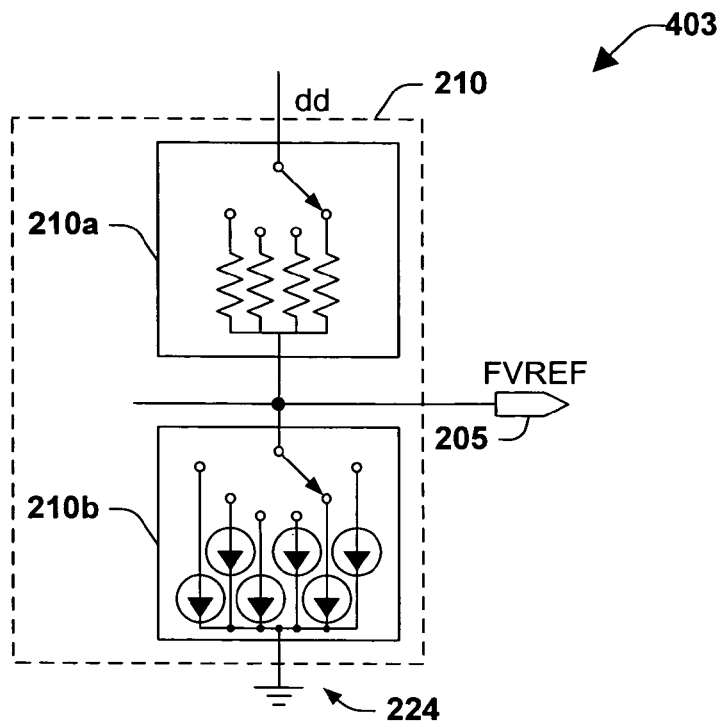
Figure 4D:
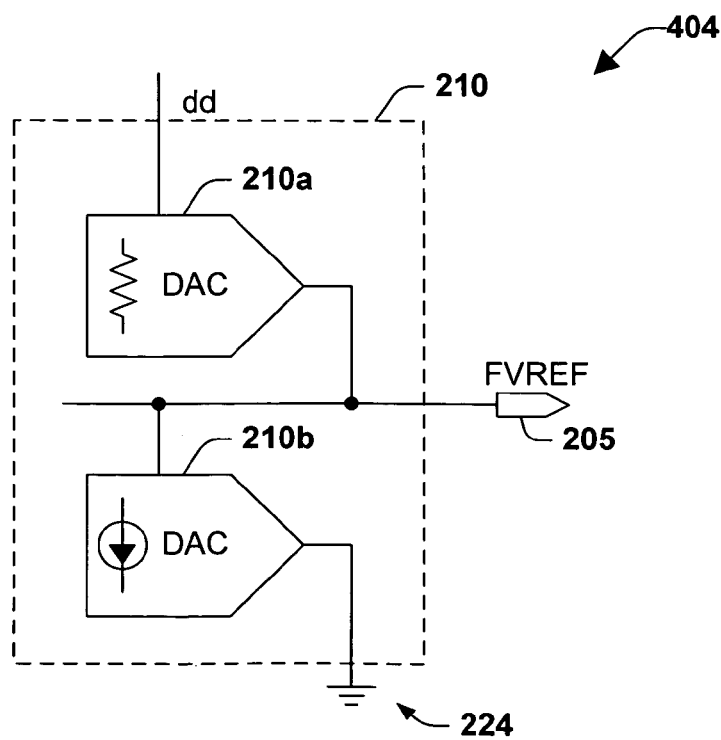

FIGS. 4C and 4D, illustrate other embodiments of a variable divider circuit 403, and 404, respectively, of the variable divider circuit 210 of FIGS. 2B and 2C, comprising a variable impedance circuit 210a and a variable reference current circuit 210b series connected as a voltage divider circuit 210. In these embodiments, impedance 210a is represented as a variable resistance, however, this resistance may also represent the final selected resistance of a resistance trimming or resistance selection circuit, for example, after an initial trimming or selection operation which may be based on a sheet resistance of the die, wafer, or wafer lot, due to the technology or process used to fabricate the same. For example, variable impedance circuit 210a of variable divider circuit 403 represents the upper portion of a voltage divider comprising multiple selectable resistors (e.g., an unsilicided polysilicon resistor), wherein one or more resistors or some other such impedance equivalent may be selected to obtain the final desired impedance for the voltage divider. In another such embodiment of the present invention, the variable impedance circuit 210a of variable divider circuit 404 represents the upper portion of a voltage divider comprising a resistive DAC operable to select one or more resistance or some other such impedance equivalent which may be selected to obtain the final desired impedance for the voltage divider.

FIGS. 4A and 4C also illustrate a variable reference current circuit 210b of the variable divider circuits 401 and 403, respectively. In these embodiments, variable reference current circuit 210b is represented as plurality of selectable reference current sources (e.g., diode connected transistors coupled with a selection transistor, a three terminal selectable current source, a plurality of reference current sources and a mux, a variable current source), wherein one or more reference current sources may be selected and summed by the circuit, for example, to obtain a final reference current source value associated with a desired reference voltage FVREF 205. Thus, in operation, the reference current conducts through the series connected impedance circuit 210a, to generate a voltage drop across both the impedance circuit 210a and the variable reference current circuit 210b, thereby comprising a voltage divider that generates the desired reference voltage FVREF between the reference node 205 and circuit ground 224.

FIGS. 4B and 4D also illustrate a variable reference current circuit 210b of the variable divider circuits 402 and 404, respectively. In another such embodiment of the present invention, the variable reference current circuit 210b of variable divider circuit 402 and 404 represent the lower portion of a voltage divider comprising a reference current source DAC operable to select one or more reference current sources or some other such reference current source equivalents which may be selected and/or summed to obtain the final reference current source value for the voltage divider, wherein the final reference current source value is associated with a desired reference voltage FVREF 205. Although one or more selectable current sources and a selection circuit or means have been illustrated to represent a variable reference current source, one or more variable reference current sources are also anticipated in the context of the present invention for the variable reference current circuit 210b of variable divider circuit 210.

Figure 5:
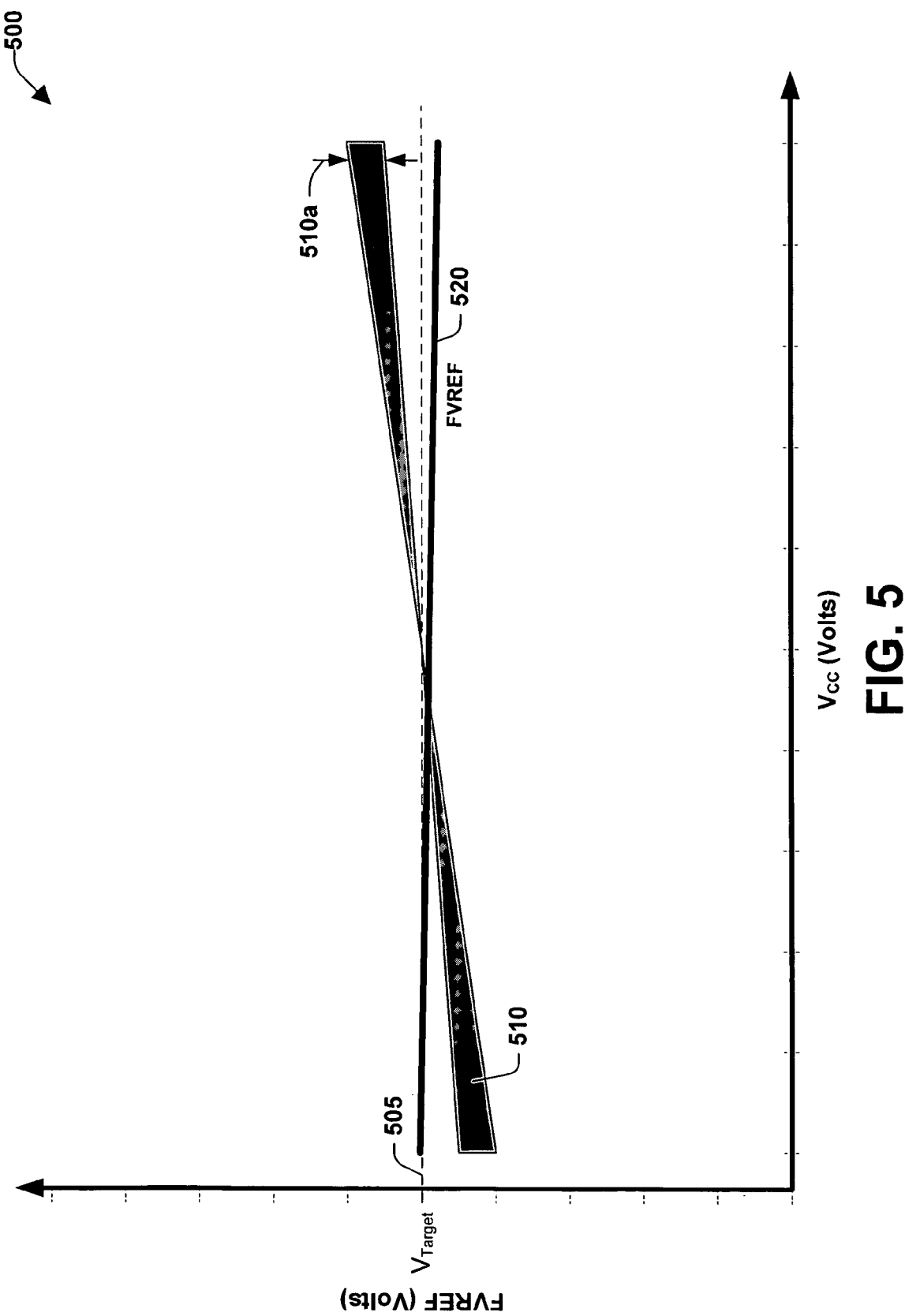
FIG. 5 is a simplified plot 500 illustrating the response 510 of a prior art bandgap voltage reference circuit contrasted to the response 520 of the exemplary fast voltage reference circuits of FIGS. 2A, 2B, and 2C.

FIG. 5 illustrates a plot 500 of the response 510 of a prior art bandgap voltage reference circuit contrasted to the response 520 of the exemplary fast voltage reference circuits 200, 201, and 202 of FIGS. 2A, 2B, and 2C, respectively. Plot 500 illustrates the applied Vcc voltage on the horizontal X axis, and the resulting voltage reference FVREF on the vertical Y axis. A target FVREF voltage level $V_{TARGET}$ 505 is shown by a horizontal dashed line. The prior art bandgap voltage reference circuit produces a response 5 10 having a value range 5 10a due to temperature variation, represented as a wide line, and a generally positive slope response as a function of Vcc. By contrast, the FVREF response 520 of the present invention has a narrow temperature response range, represented as a much narrower line, a generally negative slope response as a function of Vcc.

Thus, the FVREF response 520 of the fast voltage reference circuits of the present invention tend to somewhat increase at low Vcc voltages which provides a higher reference voltage and a higher "datab" or data buss drain voltage during read operations which provides a higher read margin at low Vcc's. In addition, and as has been discussed, the reference voltage circuit of the present also provides a high speed (e.g., about 3-5 ns from Vss to the target FVREF level of about 1.15 volts compared to about 25 ns in a conventional bandgap circuit) and temperature insensitive reference voltage. Thus a stable, fast reference voltage signal FVREF 205 is provided that is substantially independent of supply voltage $V_{CC}$ and process variations.

Designing a fast higher level reference voltage FVREF 205 (e.g., about 1.15V), is difficult when the supply voltage $V_{CC}$ is also low (e.g., about 1.4V or less). At extreme process corners and temperatures, for example, the reference voltage output of conventional reference voltage circuits can sag to lower values particularly at low supply voltages as the MOS transistors tend to go out of saturation. Thus, to maintain or increase the reference voltage and keep the MOS devices biased into saturation at these low power supply voltages, the inventors of the present invention appreciated that the feedback amplification should be increased and that the voltage divider resistors could be trimmed to avoid the effects of process variations. According to the present invention, the FVREF 205 and the bias supply dd2 voltages are both fed back to the comparator to provide an additional feed back differential voltage level as well providing a means of cancelling any thermal coefficients in the resistor dividers for improved temperature compensation.

Therefore, the inventor has found that by initializing FVREF at some portion of $V_{CC}$, FVREF behaves much more similarly over the supply voltage range of Vcc at these extreme conditions. The enable (e.g., EN_B 245 of FIGS. 3B and 3C) and/or START signal used (e.g., START 241, 242 of the start-up circuit 240 of FIG. 2C), may comprise a pulse of about 2-3 ns, for example, and may be applied to the bias supply 230 and comparator circuit 220. For example, with the EN_B signal 245, the start-up circuit 240 transistor N5 initially or momentarily grounds CDV2 at the output of the comparator 220a, to discharge any residual voltages thereat, and initializes the output voltage FVREF 205 to some portion of $V_{CC}$ based upon the minimum (default level) reference current provided by NVb and NVa.

The FVREF, current $I_{REF}$ and voltage at node "dd" can be determined by the following three equations.

$$Vdd-I*R=FVREF, \quad (1)$$

$$\tfrac{1}{2}*U*Cox*W/L*(FVREF-Vt)^2=I_{REF} \quad (2)$$

$$FVREF=W/L*Vdd \quad (3)$$

Therefore, for any given sheet resistance and any given NMOS transistor sizes (W/L) using CTLP(3:0) and CTLN(5:0), the FVREF values may be easily determined.

Figure 6:
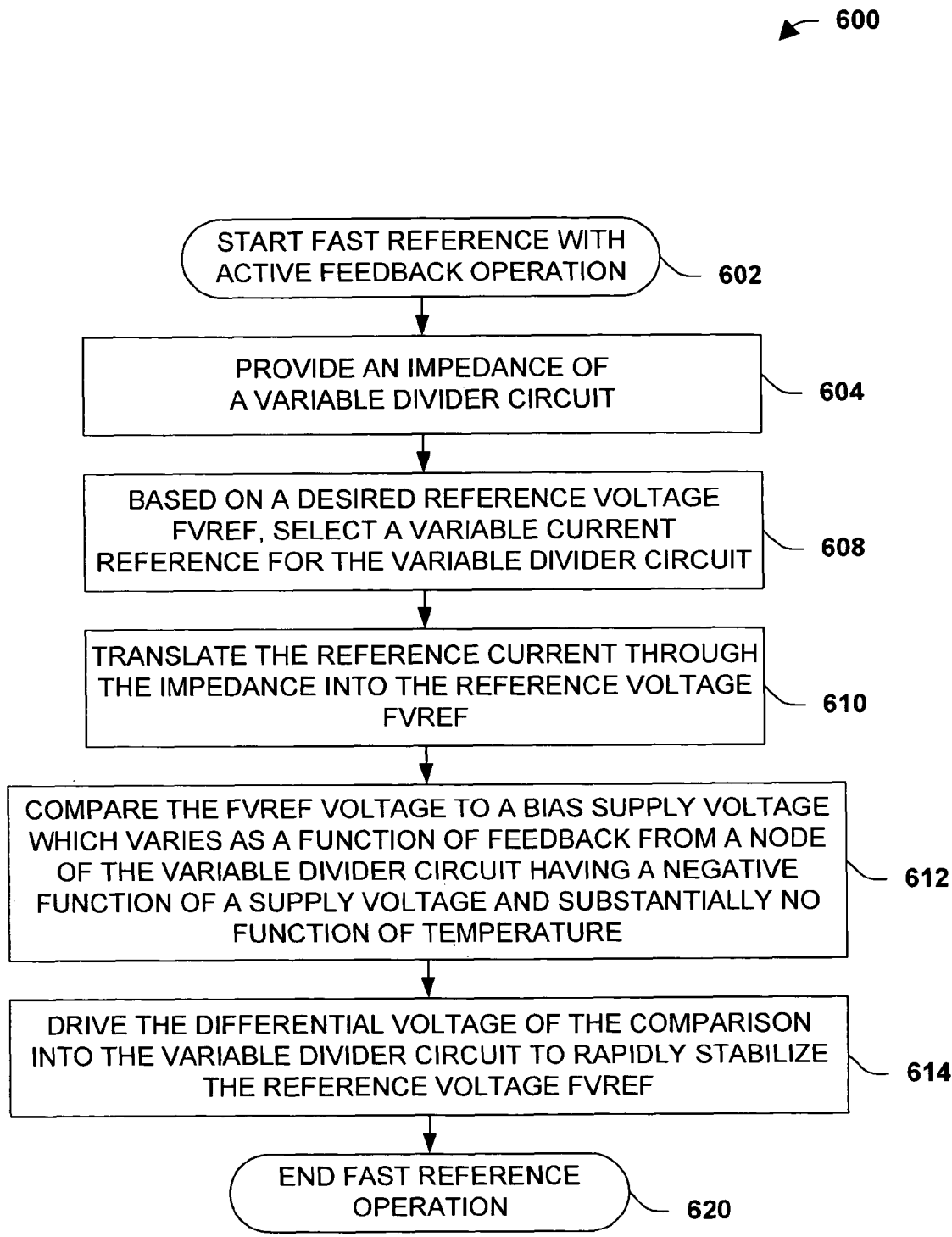
FIGS. 6 and 7 are flow diagrams illustrating exemplary aspects of method 600 for a fast voltage reference operation in association with an aspect of the present invention.
Figure 7:
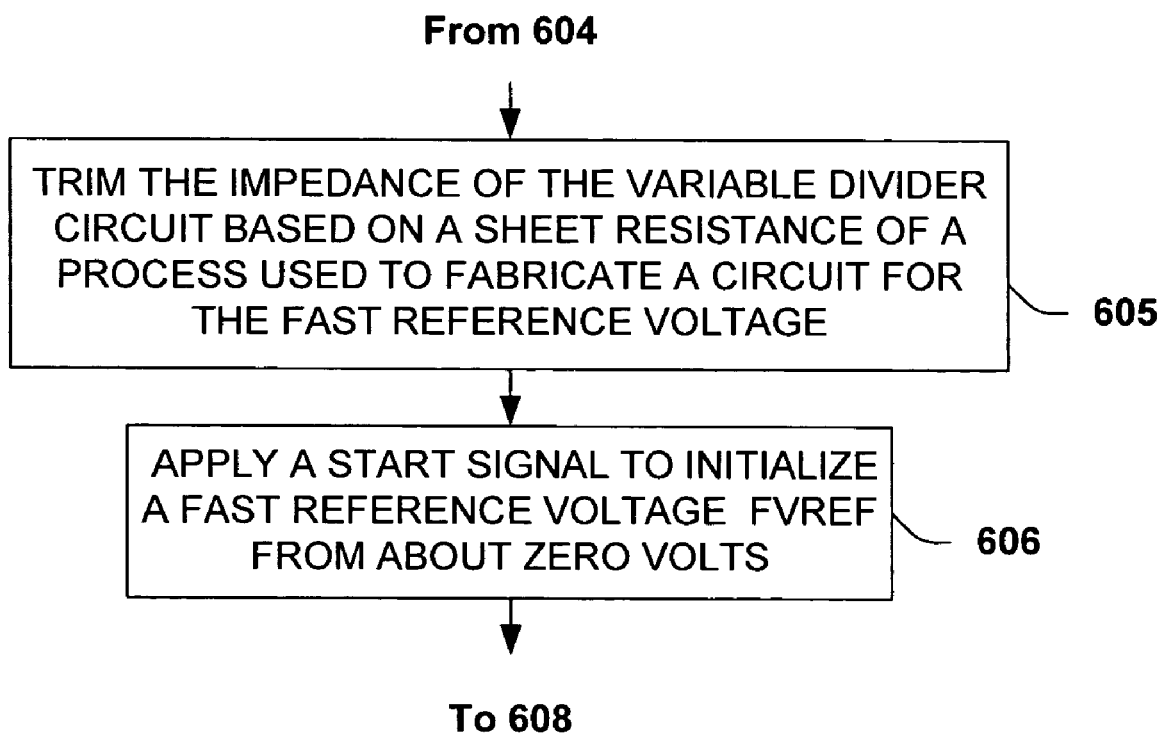

FIGS. 6 and 7 illustrate exemplary aspects of a method 600 for a fast voltage reference operation in association with the present invention and the exemplary circuits of FIGS. 2A-2C.

Another aspect of the invention provides a methodology for providing and regulating a reference voltage of a reference operation in an electronic device, that may be employed in association with the fast reference devices having active feedback illustrated and described herein, as well as with other devices. Referring now to FIG. 6, an exemplary method 600 is illustrated for regulating the reference voltage of a reference operation which may be used in a flash memory device. While the exemplary method 600 is illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the method 600 may be implemented in association with the apparatus and systems illustrated and described herein as well as in association with other systems not illustrated.

The method 600 comprises initially providing an impedance associated with a variable voltage divider circuit and selecting a variable reference current for the variable divider circuit, based on a desired reference voltage FVREF. The method 600 further comprises translating the reference current through the impedance into the reference voltage FVREF, and comparing the FVREF voltage to a bias supply voltage fed back from the variable divider circuit having a negative function of a supply voltage Vcc and substantially no function of temperature. The method 600 also comprises driving the differential voltage of the comparison into the variable divider circuit to rapidly stabilize the reference voltage FVREF to the final level that may be used in flash memory device operations.

The fast reference with active feedback operation method begins at 602. At 604, an impedance 210a (e.g., one or more resistors, a variable resistor, an unsilicided polysilicon resistor) associated with a variable voltage divider circuit is provided. Optionally, as shown at 605 in FIG. 7, the impedance 210a may be provided as part of an initial trimming operation based on a sheet resistance of a process or the technology used to fabricate the fast reference voltage circuit 200. The sheet resistance may be determined at the die, wafer, or wafer lot level of fabrication, for example, and then the impedance or resistors trimmed accordingly.

In another option, at 606, a start signal of a start-up circuit 240 may be used and applied to the fast voltage reference circuit 202 to initially discharge any residual potentials to the circuit ground (e.g., 0V), for example, with a high on the enable bar signal (e.g., EN_B 245 of FIG. 2C). Thereafter, the reference voltage circuit (e.g., 301 of FIG. 3B) is enabled with a low on the enable signal (e.g., EN_B 245 of FIG. 2C, or FIG. 3B), and the short to ground at the output "CDV2" of the comparator 220a is removed using the start-up circuit 240.

At 608, a variable reference current (e.g., 210b of FIG. 2A) for the variable divider circuit (e.g., 210 of FIGS. 2A-3C) is selected (e.g., 210b of FIGS. 4A and 4B) based on the desired reference voltage FVREF 205. For example, given the lower-level unselected current reference source provided by transistors NVa and NVb of the variable current reference circuit 210b, the FVREF output (e.g., 205 of FIG. 3A) of the reference voltage circuit 300 is initialized to about 50% of the supply voltage level (e.g., $0.5V_{CC}$).

At 610, the reference current $I_{REF}$ is translated through the impedance (e.g., 210a of FIGS. 2A-3C) into the reference voltage FVREF (e.g., 205 of FIGS. 2A-3C). Accordingly, a voltage drop is produced across both the impedance 210a and the reference current circuit 210b (e.g., reference voltage FVREF 205 with respect to ground 224) as the reference current $I_{REF}$ conducts through the impedance 210a.

At 612, the FVREF voltage is compared to a bias supply voltage (e.g., dd2 of FIGS. 2A-3C) which is supplied via a feedback path (e.g., 250 of FIGS. 2A-3C) from the variable divider circuit (e.g., 210 of FIGS. 2A-3C) having a negative function of a supply voltage Vcc (e.g., 222 of FIGS. 2A-3C) and substantially no function of temperature (e.g., 520 of FIG. 5). A comparator (e.g., 220a of FIGS. 2A-3C) within the comparator circuit (e.g., 220 of FIGS. 2A-3C) greatly amplifies the differential voltage between dd2 and FVREF generated between transistors (e.g., N1 and N2 of FIGS. 3A-3C).

Thereafter at 614, the differential voltage of the comparison is driven (e.g., by buffer/driver 220b of FIGS. 2A-2C, or pMOS transistor P8 of FIGS. 3A-3C) into the variable divider circuit (e.g., 210 of FIGS. 2A-3C) to rapidly stabilize the reference voltage FVREF (e.g., 205 of FIGS. 2A-3C) to a final level that is substantially independent of supply voltage, temperature, and process variations and that may be used in flash memory device operations.

The fast reference voltage operation thereafter ends at 620, and the method 600 may be repeated for subsequent reference voltage operations of the device.

The methodology 600 thus provides for fast, relatively higher level reference voltages from a reference circuit that operates at low supply voltage, using active feedback from a variable voltage divider to rapidly generate and stabilize a higher reference voltage. The method 600 also uses a selectable or otherwise adjustable reference current source in the variable voltage divider to provide a reference current corresponding to a desired reference voltage FVREF. The method further uses an impedance in the variable voltage divider that may be trimmed based on a sheet resistance determined for the applicable process or technology utilized for the fabrication of the reference circuit die, wafer, or wafer lot, for example. Optionally, the method 600 further uses a start-up circuit capable of enabling and discharging any residual potentials from the reference circuit for improved output repeatability, and to initialize the FVREF output voltage for a faster settling time. In addition, the method 600 uses a customized comparator circuit and feedback design to quickly settle the reference voltage FVREF to a stable final value over a wide range of supply voltages.

The reference voltage output FVREF may be applied to, for example, a wordline or a voltage booster during read operations of flash memory arrays. Therefore the method 600 generates a reference voltage FVREF that is substantially independent of variations in $V_{CC}$ supply voltage, temperature, process corners, and circuit idle periods. Other variants of methodologies may be provided in accordance with the present invention, whereby compensation or regulation of a fast reference voltage is accomplished.

Figure 8:
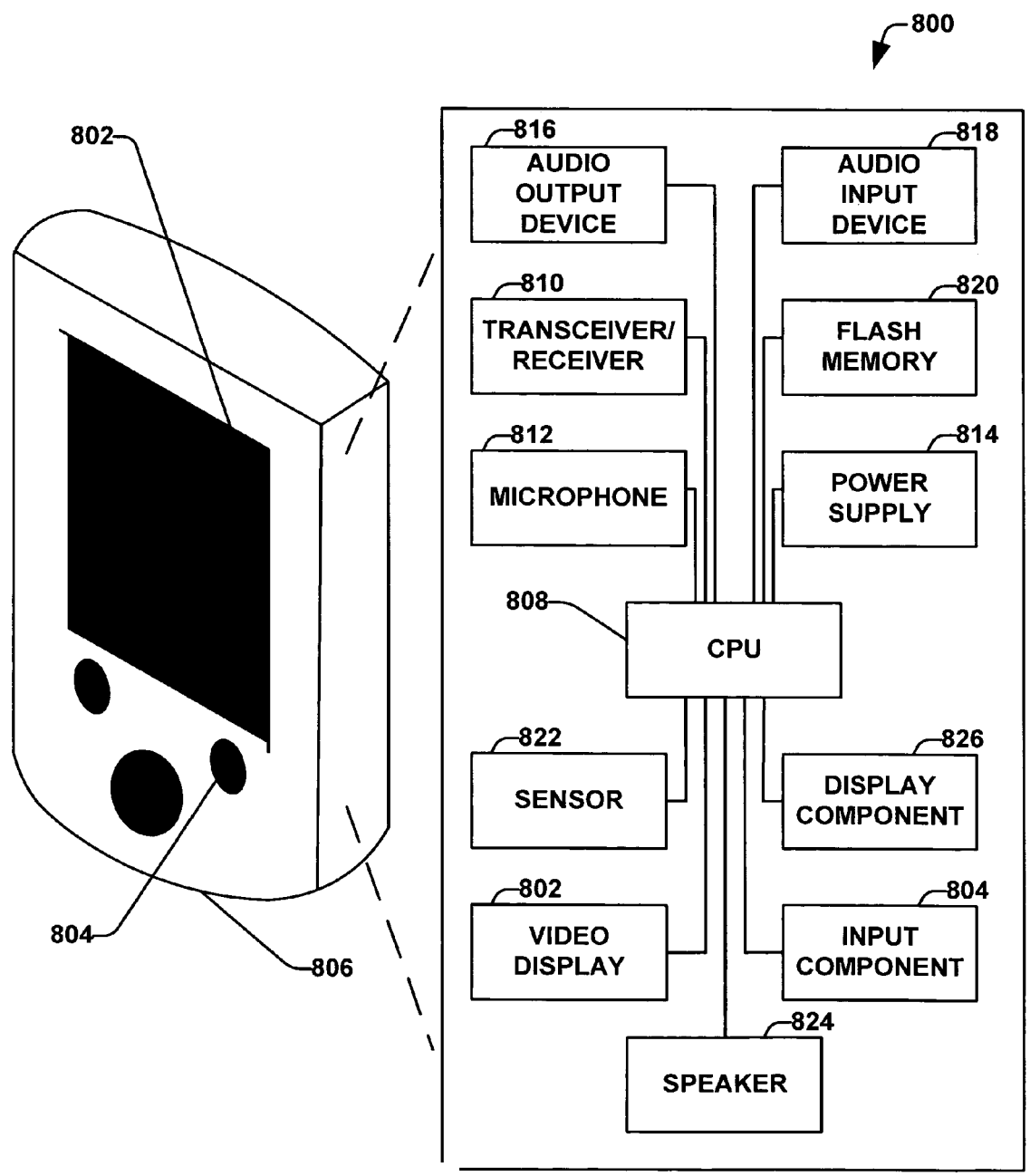
FIG. 8 is an isometric view of an electronic device and block diagram, wherein a fast voltage reference circuit may be utilized according to other aspects of the present invention.

FIG. 8 illustrates an example of a (portable) electronic device, such as a communications device or Personal Data Assistant (PDA) 800, for example, where one or more aspects of the disclosure herein may be implemented. The communication device 800 comprises a video display 802, one or more user input components 804, a housing 806, a CPU 808, a transceiver and/or receiver 810, a microphone 812, a power supply 814, an audio output device 816, an audio input 818, memory 820, various sensors 822, and speaker(s) 824. The memory 820 of the communication device 800 may comprise, for example, a fast voltage reference circuit as described herein. The one or more user input components 804 can include a keypad, buttons, dials, pressure keys, and the like. The video display 802 can be a liquid crystal display, a plasma display, an LED display, and the like, for visually displaying information. The CPU 808 can be configured to communicate with the audio input device 818, the audio output device 816 and a display component 826. The display component 826 can be separate and distinct from the video display 802. The CPU 808 can execute control functions based on inputs from the user, entered using the one or more user input components 804, for example. Based on those inputs, for example the display component can display a graph, a photo, a map, a chart, a video, and the like.

The communication device 800 can also be configured to output data as an audio signal, for example a song, a message, a warning sound, various tones, recordings, etc. The communication device 800 can be configured to communicate with other electronic devices, for example computers, cell phones, other PDAs, and the like. The communication device 800 can also be configured to (wirelessly) transmit and/or receive data. This is done utilizing the transmitter/receiver 810 to either transmit or receive data. Additionally, sensors 822 can be utilized to sense data external to the PDA 800, for example, temperatures, radiation levels, pressures, and the like. It will be appreciated that a fast voltage reference circuit as described herein can similarly be implemented in cell phones, memory sticks, flash drive devices, video camcorders, voice recorders, USB flash drives, fax machines, flash memory laptops, MP3 players, digital cameras, home video game consoles, hard drives, memory cards (used as solid-state disks in laptops), and the like.

Although the invention has been shown and described with respect to one or more implementations, equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the term "includes" is used in either the detailed description and the claims, such term is intended to be inclusive in a manner similar to the term "comprising."

What is claimed is:

1. A fast voltage reference circuit, comprising:
a bias supply configured to generate a bias supply voltage;
a variable divider circuit coupled to the bias supply by an active feedback path and configured to generate a reference voltage, the variable divider circuit comprising:
an impedance; and
a variable reference current circuit coupled to the impedance and configured to generate a predetermined current having a value independent of an impedance value of the impedance, and configured to conduct a portion of the predetermined current through the impedance, thereby generating the reference voltage at an output of the fast voltage reference circuit arranged between the impedance and the variable reference current circuit; and
a comparator circuit configured to compare the bias supply voltage to the reference voltage, and a driver circuit configured to drive the bias supply and the variable divider circuit in response to the comparison, thereby quickly stabilizing the reference voltage at the output of the fast voltage reference circuit.

2. The circuit of claim 1, wherein the impedance comprises a variable impedance configured to be selectively trimmed in response to a sheet resistance of a process employed to fabricate the fast voltage reference circuit.

3. The circuit of claim 1, wherein the impedance comprises a variable impedance circuit comprising a plurality of resistors and respective selection transistors configured to be selected and selectively trimmed in response to a sheet resistance of a process employed to fabricate the fast voltage reference circuit.

4. The circuit of claim 1, wherein the reference voltage is generated across the variable reference current circuit at the output of the fast voltage reference circuit at a reference node arranged between the impedance and the reference current circuit.

5. The circuit of claim 1, further comprising a start-up circuit connected to the bias supply and the comparator circuit, the start-up circuit operable to initially discharge a residual potential in the bias supply and the comparator circuit, and operable to initialize the reference voltage output at zero volts, the start-up circuit comprising:
a first MOS transistor having a first terminal connected to the comparator circuit, a second terminal connected to circuit ground, and a control terminal connected to an enable input terminal;
a second MOS transistor having a first terminal connected to an output of the comparator circuit, a second terminal connected to the circuit ground, and a control terminal connected to an enable bar input terminal;
a third MOS transistor having a first terminal connected to a power supply terminal, a second terminal connected to the comparator circuit, and a control terminal connected to the enable bar input terminal; and
a fourth MOS transistor having a first terminal connected to the bias supply end of the active feedback path, a second terminal connected to the bias supply, and a control terminal connected to the enable bar input terminal;
wherein the first, third, and fourth MOS transistors are operable to initially open and disable the bias supply and the comparator circuit based on a signal at the control terminals, and the second MOS transistor is operable to conduct based on a signal at the control terminal to initially discharge a residual potential at the output of the comparator circuit;
and wherein thereafter, the first, third, and fourth MOS transistors are operable to conduct enabling the bias supply and the comparator circuit based on the signal at the control terminals, and the second MOS transistor is operable to open based on the signal at the control terminal to enable a signal at the output of the comparator circuit, thereby enhancing repeatability and settling time of the reference voltage at the output of the fast voltage reference circuit.

6. The circuit of claim 1, wherein the bias supply comprises a voltage divider coupled between the active feedback path and circuit ground to provide the bias supply voltage to a negative terminal input of the comparator circuit in response to active feedback from the variable divider circuit.

7. The circuit of claim 1, wherein the variable reference current circuit comprises a plurality of selectable reference current sources individually configured to provide the predetermined current, configured such that one or more of the plurality of predetermined currents may be selectively summed to generate the current thru the impedance having a value associated with the reference voltage.

8. The circuit of claim 7, wherein the plurality of selectable reference current sources individually comprise a MOS selection transistor series connected to an enhancement type high voltage MOS transistor configured as a diode, wherein one or more of the plurality of reference current sources are selected by one or more respective selection transistors.

9. The circuit of claim 1, wherein the impedance comprises an unsilicided polysilicon material resistor.

10. A fast voltage reference circuit, comprising:
a bias supply configured to generate a bias supply voltage;
a variable divider circuit coupled to the bias supply by an active feedback path and configured to generate a reference voltage, the variable divider circuit comprising:
an impedance; and
a variable reference current circuit coupled to the impedance and configured to generate a current having a value associated with the reference voltage and to conduct the current through the impedance, thereby generating the reference voltage associated therewith; and a comparator circuit configured to compare the bias supply voltage to the reference voltage, and drive the bias supply and the variable divider circuit in response to the comparison, thereby quickly stabilizing the reference voltage;

wherein the variable reference current circuit comprises a plurality of selectable reference current sources individually configured to provide a predetermined current, configured such that one or more of the plurality of predetermined currents may be selected by a digital to analog converter to generate the current thru the impedance having a value associated with the reference voltage.

11. A fast voltage reference circuit, comprising:

a bias supply configured to generate a bias supply voltage;

a divider circuit coupled to the bias supply by an active feedback path from a feedback node of the divider circuit and configured to provide a reference voltage at an output of the fast voltage reference circuit as a function of a voltage ratio of the divider circuit, comprising:
 a variable impedance configured to be selectively trimmed in response to a sheet resistance of a process employed to fabricate the fast voltage reference circuit; and
 a variable reference current circuit configured to generate a predetermined current having a value independent of an impedance value of the variable impedance, the reference voltage generated at the output of the fast voltage reference circuit at a reference node arranged between the variable impedance and the variable reference current circuit; and a comparator circuit configured to compare the bias supply voltage to the reference voltage of the reference circuit, and operable to drive the bias supply and the divider circuit in response to the comparison, wherein the reference voltage at the output of the fast voltage reference circuit is quickly stabilized.

12. The circuit of claim 11, wherein the variable impedance comprises one or more unsilicided polysilicon resistors.

13. The circuit of claim 11, wherein the variable impedance comprises a plurality of resistors and respective MOS selection transistors configured to be selected and selectively trimmed in response to the sheet resistance of the process employed to fabricate the fast voltage reference circuit.

14. The circuit of claim 11, wherein the reference voltage is generated across the variable reference current circuit.

15. The circuit of claim 11, further comprising a start-up circuit connected to the bias supply and the comparator circuit, the start-up circuit operable to initially discharge a residual potential in the bias supply and the comparator circuit, and operable to initialize the reference voltage output at zero volts, the start-up circuit comprising:
 a first MOS transistor having a first terminal connected to the comparator circuit, a second terminal connected to circuit ground, and a control terminal connected to an enable input terminal;
 a second MOS transistor having a first terminal connected to an output of the comparator circuit, a second terminal connected to the circuit ground, and a control terminal connected to an enable bar input terminal;
 a third MOS transistor having a first terminal connected to a power supply terminal, a second terminal connected to the comparator circuit, and a control terminal connected to the enable bar input terminal; and
 a fourth MOS transistor having a first terminal connected to the bias supply end of the active feedback path, a second terminal connected to the bias supply, and a control terminal connected to the enable bar input terminal;

wherein the first, third, and fourth MOS transistors are operable to initially open and disable the bias supply and the comparator circuit based on a signal at the control terminals, and the second MOS transistor is operable to conduct based on a signal at the control terminal to initially discharge a residual potential at the output of the comparator circuit;

and wherein thereafter, the first, third, and fourth MOS transistors are operable to conduct enabling the bias supply and the comparator circuit based on the signal at the control terminals, and the second MOS transistor is operable to open based on the signal at the control terminal to enable a signal at the output of the comparator circuit, thereby enhancing repeatability and settling time of the reference voltage at the output of the fast voltage reference circuit.

16. The circuit of claim 11, wherein the variable reference current circuit comprises a plurality of selectable reference current sources individually configured to provide a predetermined current, and configured such that one or more of the plurality of predetermined currents may be selectively summed to generate the current thru the impedance having a value associated with the reference voltage.

17. The circuit of claim 16, wherein the plurality of selectable reference current sources individually comprise a MOS selection transistor series connected to an enhancement type high voltage MOS transistor configured as a diode, wherein one or more of the plurality of reference current sources are selected by one or more respective selection transistors.

18. The circuit of claim 11, wherein the variable reference current circuit comprises a plurality of selectable reference current sources individually configured to provide the predetermined current, configured such that one or more of the plurality of predetermined currents may be selected by a digital to analog converter to generate the current thru the impedance having a value associated with the reference voltage.

19. A fast voltage reference circuit, comprising:

a bias supply configured to generate a bias supply voltage;

a divider circuit coupled to the bias supply by an active feedback path from a feedback node of the divider circuit and configured to provide a reference voltage as a function of a voltage ratio of the divider circuit, comprising:
 a variable impedance configured to be selectively trimmed in response to a sheet resistance of a process employed to fabricate the fast voltage reference circuit;
 a variable reference current circuit configured to generate a current having a value associated with the reference voltage at a reference node arranged between the variable impedance and the variable reference current circuit; and a comparator circuit configured to compare the bias supply voltage to the reference voltage of the reference circuit, and operable to drive the bias supply and the divider circuit in response to the comparison, wherein the reference voltage is quickly stabilized;

wherein the bias supply comprises a voltage divider coupled between the active feedback path and circuit ground to provide the bias supply voltage to a negative terminal input of the comparator circuit in response to active feedback from the divider circuit.

20. A method of providing a reference voltage, comprising:

providing an impedance for a variable divider circuit;

selecting a predetermined current of a variable reference current circuit for the variable divider circuit, wherein the predetermined current is independent of an impedance value of the impedance;

translating a reference current through the impedance into the reference voltage using the variable reference current circuit, wherein the predetermined current is a portion of the reference current;

comparing the reference voltage to a bias supply voltage which varies as a function of feedback from a common node of the variable divider circuit having a negative function of a supply voltage and substantially no function of temperature; and driving a differential voltage resulting from the comparison into the variable divider circuit to rapidly stabilize the reference voltage substantially independent of variations in the supply voltage and process variations, the reference voltage generated at the common node that is an output of the variable divider circuit arranged between the impedance and the variable reference current circuit.

21. The method of claim 20, further comprising initially discharging a residual potential at the variable divider circuit to initialize the reference voltage at about zero volts.

22. The method of claim 20, further comprising initially applying a start signal operable to initialize the reference voltage to a predetermined reference voltage.

23. The method of claim 20, further comprising initially trimming the impedance of the variable divider circuit based on a sheet resistance of a process employed to fabricate a circuit for the reference voltage.

24. The method of claim 20, wherein the selecting of the predetermined current for the variable divider circuit, comprises selecting one of a plurality of predetermined currents, and wherein one or more of the plurality of predetermined currents may be selectively summed together to generate the reference current thru the impedance having a value associated with the reference voltage.

25. The method of claim 20, wherein translating the reference current through the impedance into the reference voltage comprises conducting the reference current through the impedance to generate the reference voltage across the variable reference current circuit.

26. An electronic device, comprising:
a user input configured to allow a user to input data;
a user output configured to output data to the user;
a central processing unit (CPU) operatively coupled to the user input and the user output and configured to receive and process the user input and to output the user output; and a memory operatively coupled to the CPU and configured to receive data from and send data to the CPU, the memory comprising a fast voltage reference circuit configured to supply a reference voltage (FVREF) to a wordline of the memory, the fast voltage reference circuit comprising a bias supply configured to generate a bias supply voltage, a variable divider circuit comprising an impedance and a variable reference current circuit, and a comparator circuit configured to compare the bias supply voltage to the reference voltage and drive the bias supply and the variable divider circuit in response to the comparison for outputting the reference voltage (FVREF) to the wordline as a function of a variable reference current in the variable divider circuit, wherein the variable reference current circuit comprises a plurality of selectable reference current sources individually comprising a MOS selection transistor series connected to an enhancement type high voltage MOS transistor configured as a diode.

27. The device of claim 26, the fast voltage reference circuit comprising:
the bias supply configured to generate the bias supply voltage;
the variable divider circuit coupled to the bias supply by an active feedback path and configured to generate the reference voltage, the variable divider circuit comprising:
the impedance;
the variable reference current circuit coupled to the impedance and configured to generate a current having a value associated with the reference voltage and to conduct the current through the impedance, thereby generating the reference voltage associated therewith; and
the comparator circuit configured to compare the bias supply voltage to the reference voltage, and drive the bias supply and the variable divider circuit in response to the comparison, thereby quickly stabilizing the reference voltage.

28. The device of claim 26, the electronic device comprising at least one of a communication device, Personal Data Assistant (PDA), cell phone, memory stick, flash drive device, video camcorder, voice recorder, USB flash drive, fax machine, flash memory, laptop, computer, scanner, MP3 player, digital camera, home video game console, hard drive and memory card.

* * * * *